United States Patent
Zumstein et al.

(10) Patent No.: US 9,869,726 B2
(45) Date of Patent: Jan. 16, 2018

(54) WIRELESS BATTERY MANAGEMENT CONTROL AND MONITORING SYSTEM

(71) Applicant: LAWRENCE LIVERMORE NATIONAL SECURITY, LLC, Livermore, CA (US)

(72) Inventors: James M. Zumstein, Livermore, CA (US); John T. Chang, Danville, CA (US); Joseph C. Farmer, Tracy, CA (US); Jack Kovotsky, Alameda, CA (US); Anthony Lavietes, Pleasanton, CA (US); James Edward Trebes, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 106 days.

(21) Appl. No.: 14/817,686

(22) Filed: Aug. 4, 2015

(65) Prior Publication Data

US 2015/0338470 A1 Nov. 26, 2015

Related U.S. Application Data

(63) Continuation-in-part of application No. 13/786,163, filed on Mar. 5, 2013, which is a continuation-in-part
(Continued)

(51) Int. Cl.
*H01M 10/48* (2006.01)
*H01M 2/02* (2006.01)
(Continued)

(52) U.S. Cl.
CPC ....... *G01R 31/3689* (2013.01); *G01R 31/362* (2013.01); *G01R 31/3606* (2013.01); *G01R 31/3658* (2013.01); *H01M 2/0285* (2013.01); *H01M 2/1016* (2013.01); *H01M 10/486* (2013.01); *H01M 10/052* (2013.01)

(58) Field of Classification Search
CPC ...... H01M 10/42–10/4285; H01M 2010/4278; G01R 31/3682; G01R 31/3689
See application file for complete search history.

(56) References Cited

U.S. PATENT DOCUMENTS

| 2005/0038614 A1* | 2/2005 | Botts | G01R 31/3606 702/63 |
| 2009/0267560 A1* | 10/2009 | Toya | H01M 2/1022 320/108 |

(Continued)

FOREIGN PATENT DOCUMENTS

| WO | WO 2010025761 A1 * | 3/2010 | ................ A62C 3/06 |
| WO | WO 2010079597 A1 * | 7/2010 | .......... H01M 10/486 |
| WO | WO 2010089000 A2 * | 8/2010 | .......... H01M 2/1252 |

*Primary Examiner* — Jonathan Crepeau
*Assistant Examiner* — Jacob Buchanan
(74) *Attorney, Agent, or Firm* — Eddie E. Scott

(57) ABSTRACT

A battery management system using a sensor inside of the battery that sensor enables monitoring and detection of various events in the battery and transmission of a signal from the sensor through the battery casing to a control and data acquisition module by wireless transmission. The detection of threshold events in the battery enables remedial action to be taken to avoid catastrophic events.

9 Claims, 7 Drawing Sheets

Related U.S. Application Data of application No. 13/772,620, filed on Feb. 21, 2013, now Pat. No. 9,267,993.

(60) Provisional application No. 61/650,359, filed on May 22, 2012, provisional application No. 61/650,649, filed on May 23, 2012, provisional application No. 61/650,649, filed on May 23, 2012.

(51) Int. Cl.
*G01R 31/36* (2006.01)
*H01M 2/10* (2006.01)
*H01M 10/052* (2010.01)

(56) References Cited

U.S. PATENT DOCUMENTS

| | | | |
|---|---|---|---|
| 2011/0039137 A1* | 2/2011 | Engle | H01M 10/482 429/90 |
| 2011/0212349 A1* | 9/2011 | Naruse | H01M 10/486 429/50 |
| 2012/0070703 A1* | 3/2012 | Wahl | H01M 2/1252 429/53 |
| 2012/0318586 A1* | 12/2012 | Atarashi | B60L 5/005 180/2.1 |
| 2013/0312947 A1 | 11/2013 | Bandhauer et al. | |
| 2013/0314094 A1 | 11/2013 | Farmer et al. | |
| 2013/0314242 A1 | 11/2013 | Farmer et al. | |
| 2013/0316198 A1 | 11/2013 | Bandhauer et al. | |

* cited by examiner

WIRELESS BATTERY MANAGEMENT CONTROL AND MONITORING SYSTEM

CROSS-REFERENCE TO RELATED APPLICATIONS

This application is a Continuation-in-Part (CIP) of Co-pending U.S. Non-Provisional Patent Application No. 13/786,163 filed Mar. 5, 2013, by Todd M. Bandhauer and Joseph C. Farmer et al, titled, "Battery Management System with Thermally Integrated Fire Suppression," which claims priority based upon U.S. Provisional Patent Application No. 61/650,359 filed May 22, 2012 and U.S. Provisional Patent Application No. 61/650,649 filed May 23, 2012. The aforementioned applications are incorporated herein by this reference.

This application is also a Continuation-in-Part (CIP) of Co-pending U.S. Non-Provisional Patent Application No. 13/772,620 filed Feb. 21, 2013, by Joseph C. Farmer et al, titled, "Battery Management System with Distributed Wireless Sensors," which claims priority based upon U.S. Provisional Patent Application No. 61/650,649 filed May 23, 2012, titled, "Lithium Ion Battery Management System with Distributed Wireless & Fiber Optic Sensors, and Embedded Fire Suppression System." The aforementioned applications are incorporated herein by this reference.

STATEMENT AS TO RIGHTS TO APPLICATIONS MADE UNDER FEDERALLY SPONSORED RESEARCH AND DEVELOPMENT

The United States Government has rights in this application pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present application relates to control and monitoring systems and particularly to advanced battery management systems and systems for managing lithium ion and other batteries.

State of Technology

This section provides background information related to the present disclosure which is not necessarily prior art.

Current technology uses direct wiring to monitor battery voltages, current monitoring, temperature sensors, strain gauges etc. The cable bundles must be run through the system to a monitoring unit. This adds a large expense in cost, complexity, and weight. Because of the large amount of wiring needed in the prior art systems, not every battery component is monitored leaving gaps in the system allowing undetected failures.

Lithium-ion batteries are proven technology, and are leading candidates for terrestrial electric vehicles, back-up power in airplanes and many other uses. Virtually all modern cellular telephones and portable computers use lithium-ion batteries for energy storage. Other important applications of this technology include emerging electric vehicles, such as the Tesla sports car, various autonomous underwater vehicles (AUVs), manned underwater vehicles (UUVs), the Mars Rover, and large laser systems.

This technology has also enjoyed limited but successful use in autonomous underwater vehicles used for oceanographic research. Unfortunately, lithium ion batteries have been plagued by a history of significant safety incidents, with some causing serious human injury and property damage (loss of a commercial cargo plane, for example). The lithium-acid battery may prove to be relatively expensive, has safety issues that must be dealt with, but has exceptional performance characteristics, that make it a leading candidate for consideration. Designs would have to emphasize safety, thermal management during charge and discharge, and enhanced battery management systems.

Codes for BMS control algorithms have unique attributes, in that they enable the simultaneous solution of those equations that account for the flow of fluid and heat, chemical reactions, current flow and mechanical stress. However, the equations that describe electrode kinetics and ionic transport have not yet been integrated into the code.

The modern lithium-ion battery has: an anode that consists of a graphite-based active material (Li—C6) with carbon filler and PVDF binder coated onto a copper foil current collector; a cathode that consists of a transition metal oxide or iron phosphate (Li—NiO2, Li—CoO2, Li—MnO2, or Li—FePO4) active material with a PVDF binder coated onto an aluminum foil current collector; a microporous porous polyethylene separator, and an electrolyte consisting of a mixed organic carbonate solvent (EC:DMC:DEC) and LiPF6 salt. The liquid cylindrical or prismatic cells are contained in a hermetically sealed metal can, while polymer-gel cells are contained in a soft aluminum-polyethylene laminate package, with thermally laminated seams. In the case of the polymer-gel cell, the polyethylene separator is usually coated on both sides with porous PVDF layers.

This battery can operate from −40 to +60 degrees Centigrade. The open-circuit voltage is 4.1 V, with operation between 4.0 and 3.0 V (possibly as low as 2.8 V). The specific power, power density, specific energy and energy density are 1100-74 W/kg, 2270-147 W/L, 75-182 Wh/kg, and 139-359 Wh/L, respectively. The cycle life of the best state-of-the-art lithium-ion batteries can be as great as 1500 cycles (to 80% of the original capacity). However, poorly constructed cells can have much shorter lives (300 cycles representing poorer cells). Based upon published data, the cost of energy storage is believed to be approximately $300 per kilowatt-hour (though some quote $1000 per kilowatt-hour).

One key advantage of such flow batteries is the ability to scale the batteries capacity linearly with the size of the reservoirs used for storing the anolyte and catholyte. Other advantages include thermal management, the use of abundant raw materials, efficiency, and the relative ease of construction. The ZnBr battery was patented over 100 years ago, but has never enjoyed widespread commercialization. Technical problems have included the formation of zincdendrites during repeated charging and discharging, which can lead to internal shorts within the cell, and the relatively high solubility of Br in the aqueous electrolyte required by the Zn electrode.

The modern lithium ion battery was developed to overcome safety problems encountered with early rechargeable batteries with metallic lithium anodes. Metallic lithium can react with a wide variety of polymeric materials involved in cell construction, including but not limited to fluorinated polymers such as Teflon. In contrast, the lithium ion battery involves two intercalation electrodes which serve as "nanoscale parking garages" for reduced metallic lithium atoms, thereby avoiding the presence of free metallic lithium in the cell. The use of these two intercalation electrodes, with lithium being shuttled from one parking garage to the other is known as the "rocking chair mechanism" which the intercalation cathode is usually a transition metal oxide or iron phosphate, and the intercalation anode is usually a natural or synthetic graphite. In some cases, lithium alloys such as Li—Sn or Li—Si are used in lieu of graphite.

One problem encountered with advanced battery systems, including lithium ion batteries which rely on the formation of lithium-intercalation compounds at both electrodes, is the plating of dangerous metallic lithium on either the anode active material (graphite) or cathode active material (transition metal oxide or iron phosphate) during repeated cycling. This problem can be exacerbated by attempts to quickly recharge the battery, which will be a temptation in automotive applications. Who wants to wait an hour or two at the filling station to refuel their car? If there is a failure to maintain good contact between adjacent pressure with uniform stack.

The avoidance of lithium plating requires precise understanding of the primary and secondary current distributions inside individual cells, not only at the electrode scale, but also on the length scale of individual micron-sized particles of active material, and on the scale of interatomic spacing in the intercalation compounds that are formed. In addition to modeling the other complexities of the batteries and battery packs (series-parallel strings of individual cells), which include thermal transport and mechanical stresses, it is necessary to make precise predictions of the current and potential distribution between the anodes and cathodes, as well around the individual particles of active material on both electrodes. The physics that must be well understood before predictable and reliable battery packs can be designed include: battery chemistry of nominal charge/discharge; abnormal ageing at a defect (local chemistry, heat, voltage, stress); electric fields and current flow within the cell; heat generation and cell cooling, thermal run-away; convection fluid flow within the electrolyte; external coolant flow; stress and material failure due to volumetric changes during charge/discharge cycle; chemical deflagration of run-away battery; dynamic structural failure of run-away battery cell and battery system; in principle, modern computational modeling could be applied to the design of high performance batteries and battery packs, to help ensure that robust, thermally-stable systems have been built.

Safety is the leading show-stopper for large Li-ion cells, and the battery packs built from those cells. Despite decades of conventional safety testing serious problems remain. Lithium-ion explosions and fires occur frequently in both products and manufacturing plants. In regard to electric vehicle applications, statistics indicates that 1 in every ~30,000 electric vehicles with a lithium ion battery pack will burn and/or explode. Given that an electric vehicle with a 100-mile range is capable of releasing a quantity of energy equivalent to ~500 sticks of dynamite, this is alarming.

As a lithium ion battery begins to undergo heating, which can be caused by ohmic heating, internal shorting, or the application of heat from outside the cell, a sequence of chemical reactions occur within the Li-ion system, ultimately leading to thermal runaway. During such catastrophic events, numerous chemical reactions begin occurring sequentially. While the inside of the Li-ion cell is oxygen-free, enough oxygen can be liberated from the decomposition of the transition metal oxide active material in the cathode during thermal runaway, regardless of the initiating event, to support limited combustion of the organic carbonate solvents in the electrolyte. Localized internal shorts quickly drive such high performance energy storage systems into thermal runaway, with subsequent propagation to other lithium-ion cells in the battery pack, with further propagation to other packs within the system if they exist.

International Patent Application No. WO 2010/025761 for a system for fire protection provides state of technology information including the following information: "The batteries of the backup power thus contain high amount of energy, and a failing battery cell, e.g. by external or internal short circuit or overload, will quickly become very hot. The heat emitted from the failing cell will heat up an adjacent battery cell, which in turn will heat up the next cell and so on, and this of course constitutes a huge fire hazard. As an example, Li-ion battery cells exceeding a critical temperature may result in opening of the cell, known as venting of the cell, with a release of highly inflammable gases that can easily catch fire. If this happens there is a large risk of the whole battery storage system being destroyed." The disclosure of International Patent Application No. WO 2010/025761 is incorporated herein in its entirety for all purposes by this reference.

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

A system is provided for monitoring battery of a battery wherein the battery includes a casing. A sensor is located inside of the casing that senses at least one parameter of the battery and provides a battery parameter signal. A data collection and storage unit is located outside of the casing. In one embodiment a RF transmitter and receiver is located outside of the casing and operatively connected to the data collection and storage unit. A magnetic induction communication system is operatively connected to the sensor and transmits the battery parameter signal from the sensor to the RF transmitter and receiver and the RF transmitter and receiver provides the battery parameter signal to the data collection and storage unit. The magnetic induction communication system includes a first induction coil located inside of the casing and a second induction coil located outside of the casing.

The disclosed apparatus, systems and methods provide battery management using a sensor inside of the battery. The sensor enables monitoring and detection of various events in the battery and transmission of a signal from the sensor through the battery casing to a control and data acquisition module by wireless transmission. The detection of threshold events in the battery enables remedial action to be taken to avoid catastrophic events.

Casings of a number of types of batteries, such as lithium batteries, are metal or other material that blocks RF transmission. Signals of battery parameters inside of the battery cannot be transmitted through the casing by RF signal. The inventors' have solved this problem by utilizing various embodiments of induction coils that provide a magnetic induction communication system that allow parameter signals to be transmitted through the casing of the battery.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

DETAILED DESCRIPTION OF SPECIFIC EMBODIMENTS

Figure 1A:
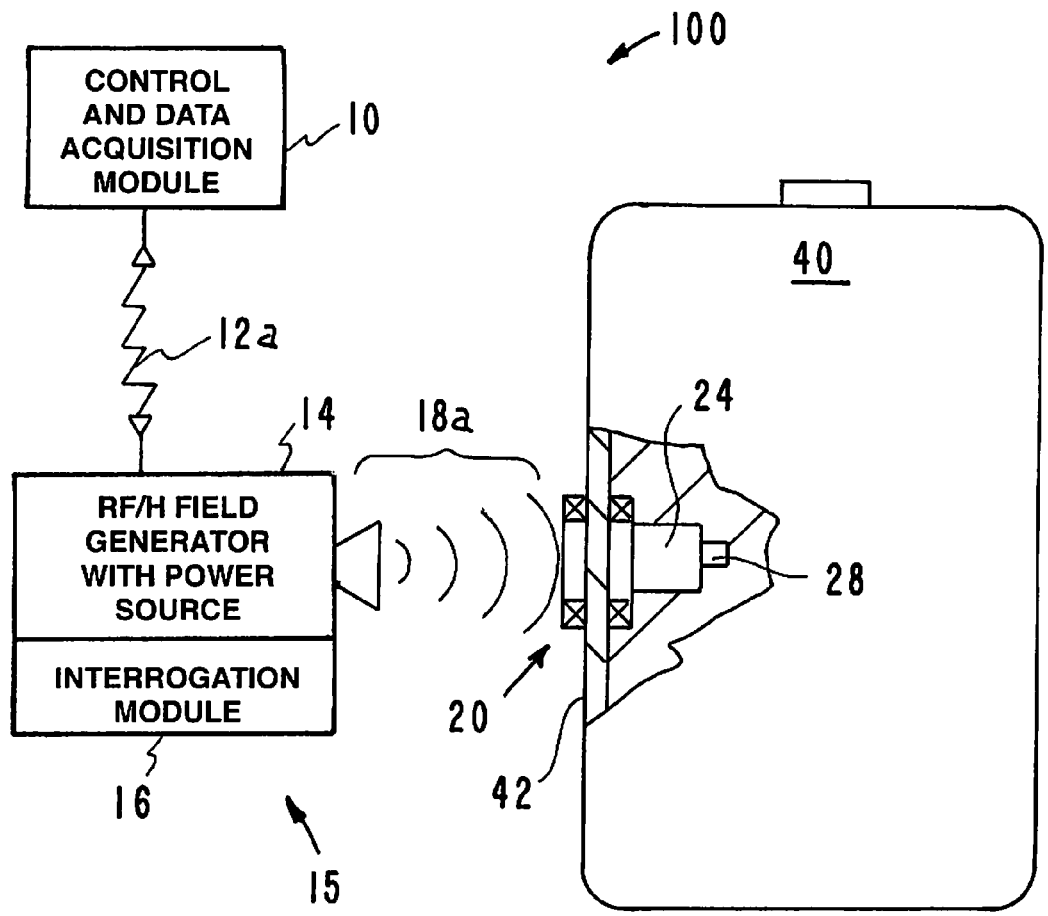
FIGS. 1A and 1B illustrate embodiments of the disclosed wireless battery management, control and monitoring apparatus, systems, and methods.

Referring to the drawings, to the following detailed description, and to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

There is a need for an advanced management system for energy storage devices. There is also a need for a battery management system that will provide detailed information about conditions in the individual cells of a battery and that will report and provide documentation of the detailed information about conditions in the individual cells of a battery. For example, lithium ion batteries have been plagued by a history of significant safety incidents, with some causing serious human injury and property damage (loss of commercial cargo plane, for example). The Jan. 17, 2013 article, "*The battery that grounded Boeing*" in CNN Money stated: "U.S. officials grounded Boeing's new 787 Dreamliner because the aircraft's advanced batteries appear to be malfunctioning. But what's the problem? And can it be fixed? To reduce weight on the plane, Boeing relied heavily on lithium ion batteries—the same type found in mobile phones and laptops. While these batteries can produce a lot of power for their weight, they're also prone to problems. It was these same batteries that caught fire in laptops a few years back and, more recently, were suspected culprits in electric car fires." The Jan. 28, 2013 article, "*Problem in Boeing 787 planes still baffles*" in The Boston Globe stated: "Although a fire destroyed one of two big batteries on a Boeing 787 parked at Logan International Airport in Boston three weeks ago, a quick examination of the second battery found "no obvious anomalies," the National Transportation Safety Board said Sunday. The batteries use a lithium-ion chemistry, which has been in use for many years in many applications but is new in airplanes. Investigators say the problem could be the batteries or with the associated electronics used to manage them."

Applicant's wireless battery management, control and monitoring apparatus, systems, and methods provide a solution to the lithium ion battery problems by providing a battery management system. Applicant's wireless battery management, control and monitoring apparatus, systems, and methods will be further explained, illustrated, and described in the following examples of systems constructed in accordance with the present invention. The examples demonstrate the utility and/or function of the invention and help provide a full description of the invention. The examples are intended to be illustrative and not limitative of the present invention.

Figure 1B:
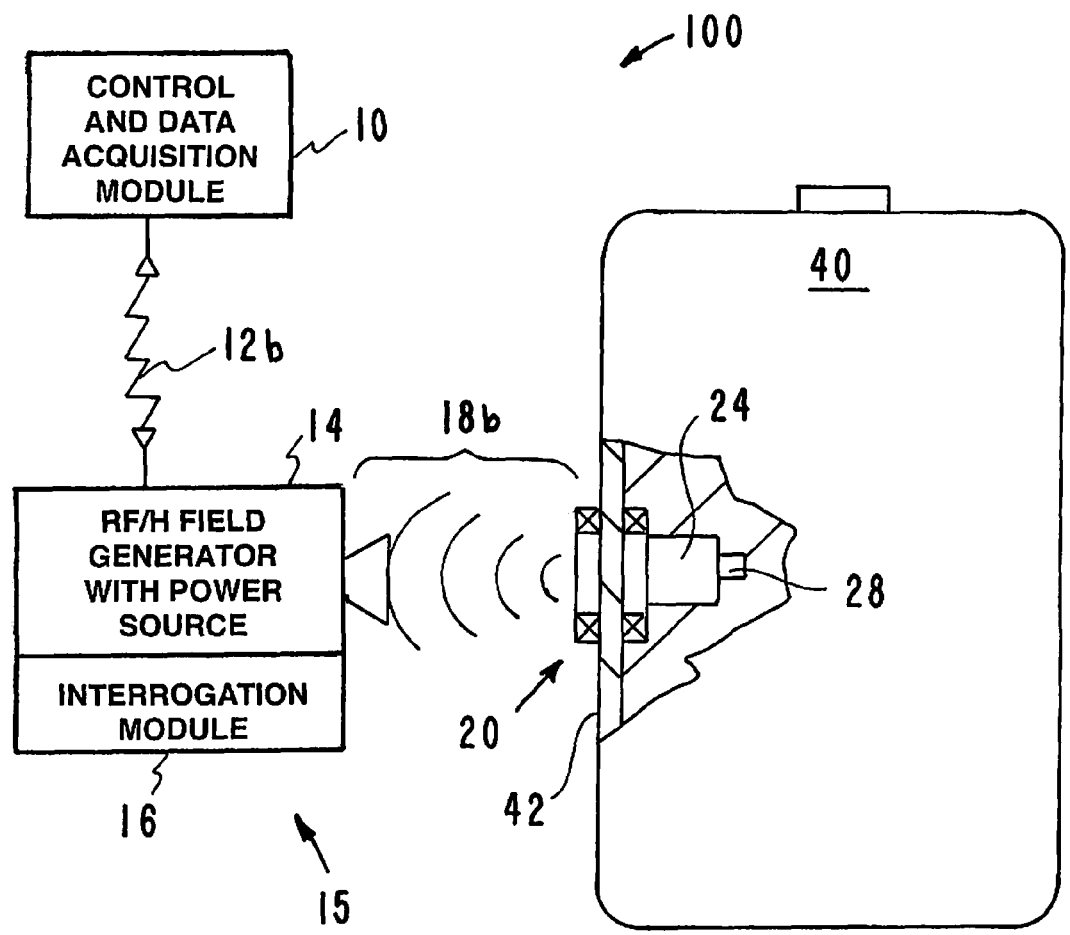

Referring now to the drawings and in particular to FIGS. 1A and 1B, embodiments of the inventors' battery management apparatus, systems and methods are illustrated. The apparatus, systems and methods are designated generally by the reference numeral 100.

The apparatus, systems and methods 100 provide battery management using a sensor inside of the battery. The sensor enables monitoring and detection of various events in the battery and transmission of a signal from the sensor through the battery casing to a control and data acquisition module by wireless transmission. The detection of threshold events in the battery enables remedial action to be taken to avoid catastrophic events.

The apparatus, systems and methods 100 leverage specialized computer models and codes as control algorithms in a smart battery management system. The equations describe electrode kinetics and ionic transport integrated into the code. This modeling enables designers to account for subtle, but very important effects such as damage of local circuitry and other vehicular components by the pyrotechnic effect of excessive temperature and fire. This can be used to activate cooling systems, and engineered "fire breaks" and "internal fire suppression methods." The inventors' battery management apparatus, systems and methods 100 have many uses, for example they have use in connection with battery packs for electric and hybrid-electric vehicles, naval systems, aerospace systems, grid storage, and uninterruptable power supplies.

Referring now to FIGS. 1A and 1B, the apparatus, systems and methods 100 are illustrated and the following components are identified by the respective reference numerals: control and data acquisition module (located remotely) 10, wireless signal (for example Bluetooth) 12a, RF generator with power source 14, Interrogation module 16, RF signal (power) 18a, induction coils array 20, sensor electronic module 24, temperature sensor 28, battery 40, and battery casing 42. The RF generator with power source 14 and the interrogation module 16 are collectively referred to as a transmitter/receiver 15. Although the apparatus, systems and methods 100 are shown with a temperature sensor 28, it is to be understood that the sensor 28 can be a sensor that senses other parameters other than temperature. The other parameters include cell voltage, cell current, cell impedance, cell temperature, cell internal pressure, stress and strain in the cell, electrolyte leakage, gas evolution and leakage, optical and nuclear particle transmission and scattering, pyrotechnic displays, and/or other parameters.

Casings of a number of types of batteries, such as lithium batteries, are metal or other material that blocks RF transmission. Signals of battery parameters inside of the battery cannot be transmitted through the casing by RF signal. The inventors' have solved this problem by utilizing induction coils and relay coils that provide a magnetic induction communication system that allow parameter signals to be transmitted through the casing of the battery.

The structural components of the battery management apparatus, systems and methods 100 having been identified and described, additional details of the battery management apparatus, systems and methods 100 will now be considered. The apparatus, systems and methods 100 enable the early detection of various events in the battery to allow rapid response to prevent and suppress such events before the results become catastrophic.

As shown in FIG. 1A, the control and data acquisition module 10 is located remotely from the battery 40. The control and data acquisition module 10 sends a wireless signal 12a to the RF generator 14. This can be accomplished by state of the art wireless transmission systems such as Bluetooth. The RF generator 14 then sends a RF signal 18a to the induction coils array 20. The induction coils array 20 then powers up the sensor electronic module 24. In turn the sensor electronic module 24 receives signals from the temperature sensors 28. The temperature sensor 28 monitors the temperature in the battery 40. The temperature sensor data is recorded by the sensor electronic module 24.

As shown in FIG. 1B, the temperature sensor data that has been recorded by the sensor electronic module 24 is transmitted from the battery 40 by a signal back through the induction coils array 20 and RF signal 18b. The signal is picked up by the interrogation module 16. The interrogation module 16 then sends the temperature data via wireless transmission 12b to the control and data acquisition module 10.

The apparatus, systems and methods 100 illustrated in FIGS 1A and 1B and described above utilize a temperature sensor 28 to monitor the temperature in the battery 40; however, it is to be understood that in various embodiments the sensor module 10 can be a sensor that senses and monitors other parameters in the battery 40. For example, the sensor module 24 can be a sensor that enables the detection of parameters including one or more of the following parameters: cell voltage, cell current, cell impedance, cell temperature, cell internal pressure, stress and strain in the cell package, electrolyte leakage, gas evolution and leakage, optical and nuclear particle transmission and scattering, and any pyrotechnic displays internal to the battery pack that may be attributed to the onset of thermal runaway. The sensor module 24 may be either active or passive, with communication possible via the RF and magnetic resonance components. Once the sensor module 24 detects the onset of an event, the signal is used to appropriately manage batter operation (charge and discharge), and remedial action systems can be activated.

Figure 2:
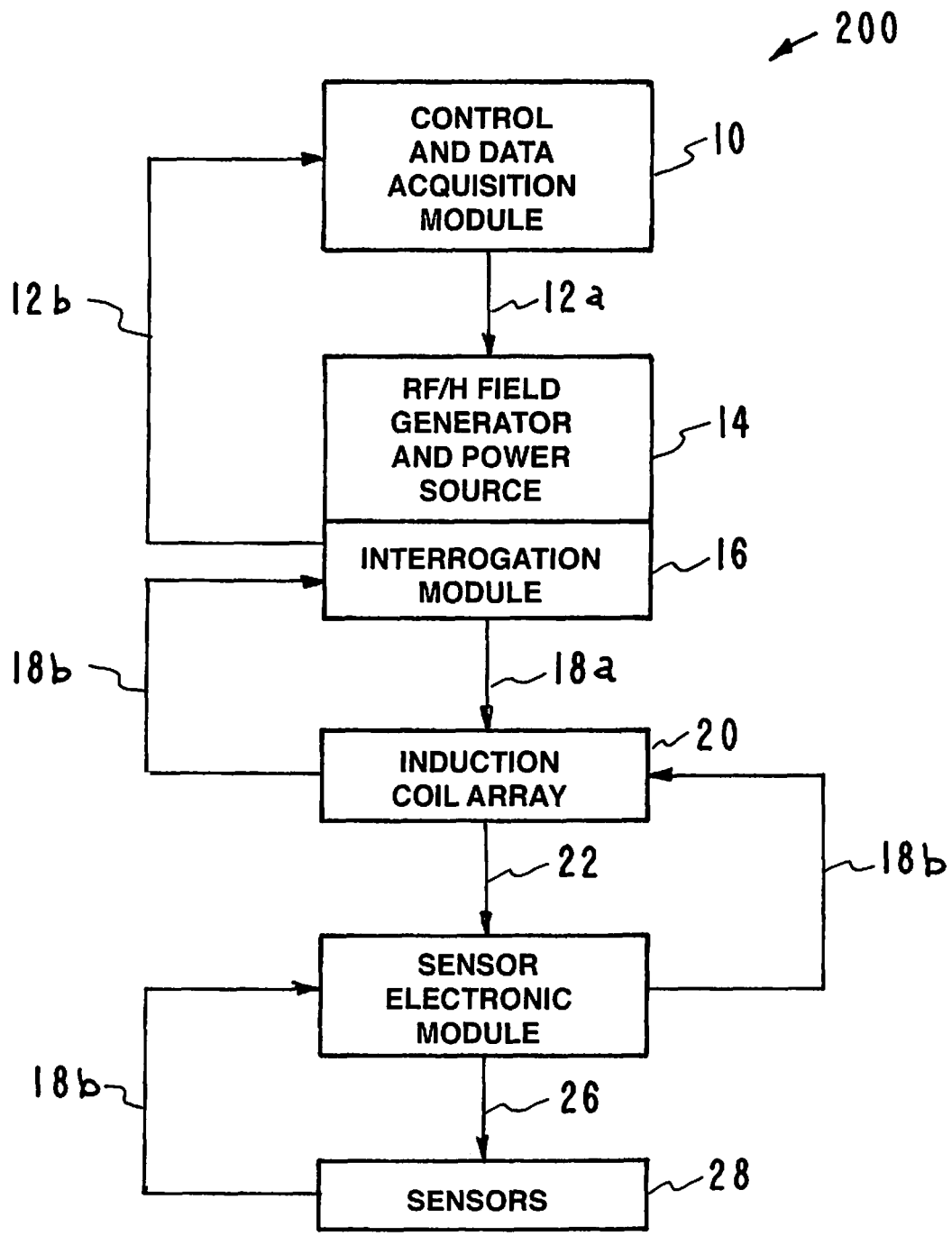
FIG. 2 is a flow chart that illustrates additional embodiments of the disclosed wireless battery management, control and monitoring apparatus, systems, and methods.

Referring now to FIG. 2 a flow chart provides additional information describing and explaining the inventors' battery management apparatus, systems and methods. The flow chart is designated generally by the reference numeral 200. The flow chart 200 demonstrates that the inventors' battery management apparatus, systems and methods can utilize a sensor inside the battery for monitoring and detection of various events in the battery. Once the battery parameter is detected a signal from the sensor is transmitted through the battery casing to a control and data acquisition module by wireless transmission. The detection of threshold events in the battery enables remedial action to be taken to avoid catastrophic events. The inventors' battery management apparatus, systems and methods illustrated and described in connection with the flow chart 200 often refers to the battery parameter "temperature;" however it is to be understood that other parameters are also included including cell voltage, cell current, cell impedance, cell temperature, cell internal pressure, stress and strain in the cell, electrolyte leakage, gas evolution and leakage, optical and nuclear particle transmission and scattering, pyrotechnic displays, and/or other parameters.

The flow chart 200 illustrates the cooperative relationship of the following components: control and data acquisition module 10, wireless signal (example, Bluetooth) 12a, WIFI signal with sensor data, RF generator and power source 14, interrogation module 16, RF signal (power) 18a, RF signal with sensor data 18b, induction coil array 20, power 22, sensor electronic module 24, power 26, and sensors 28.

As shown in the flow chart 200, control and data acquisition module 10 sends a wireless signal 12a to the RF generator and power source 14. The interrogation module 16 is connected to the RF generator and power source 14 and it sends a wireless signal 18a to the induction coils array 20. The induction coils array 20 then provides power 22 to the sensor electronic module 24. The sensors 28 receive power 26 and monitor the parameters in the battery and provide sensor data 18b that is recorded by the sensor electronic module 24. The sensor data 18b is transmitted back to the control and data acquisition module 10.

The flow chart further shows that the battery parameter that has been monitored and detected is transmitted from the battery by a signal back through the induction coils array to the interrogation module and then to the control and data acquisition module. The flow chart shows an embodiment wherein temperature information is monitored and detected in the battery. The sensors 28 send the data 18b to the sensor electronic module 24. As shown in the flow chart, the sensor data 18b is transmitted as a RF signal back thru the induction coils array to the interrogation module 16. The interrogation module sends the data to the control and data acquisition module 10.

Figure 3:
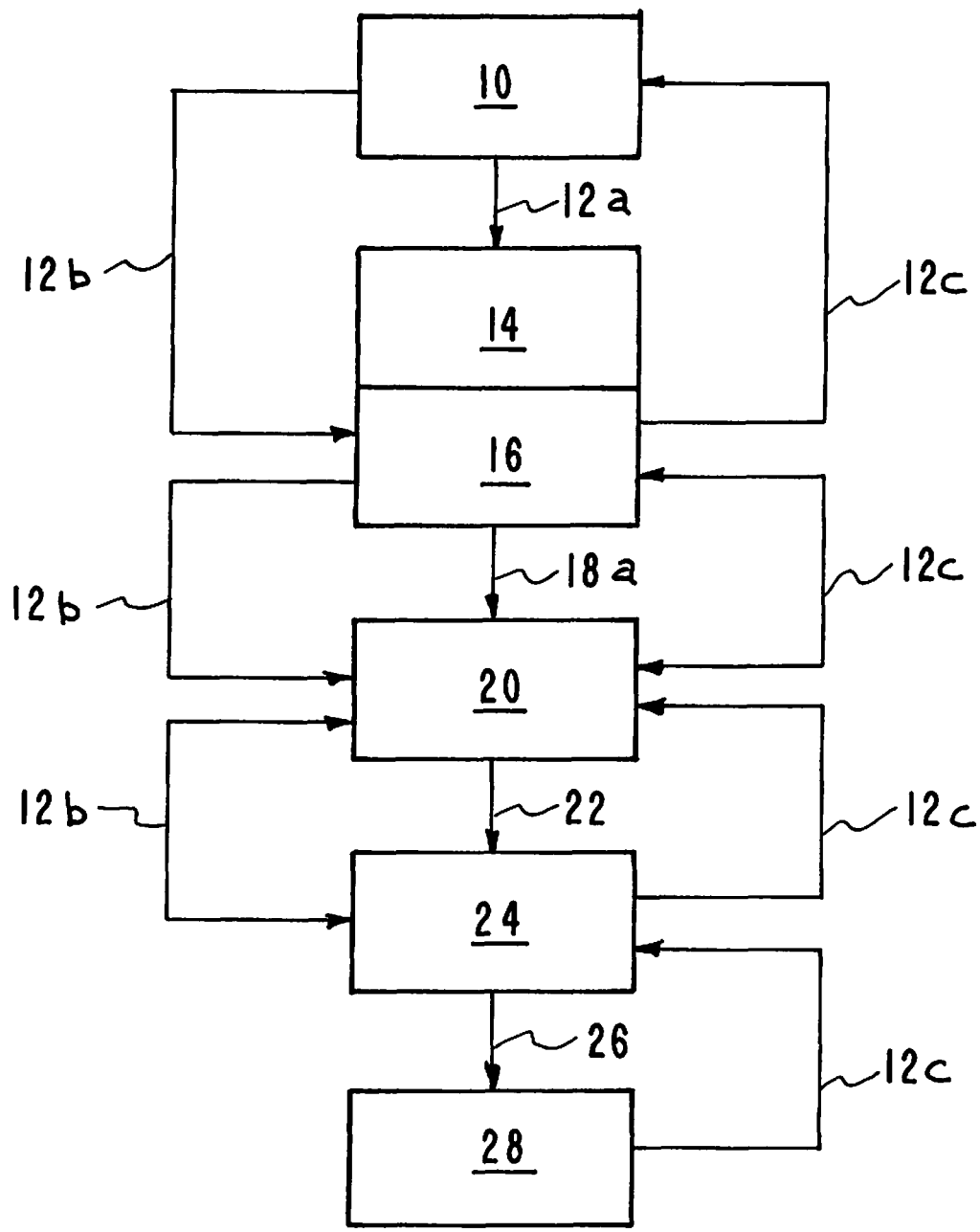
FIG. 3 is another flow chart provides information describing and explaining the inventors' battery management apparatus, systems and methods.

Referring now to FIG. 3 another flow chart provides information describing and explaining the inventors' battery management apparatus, systems and methods. The flow chart demonstrates that the inventors' battery management apparatus, systems and methods can utilize a sensor inside the battery for monitoring and detection of various events in the battery. Once the battery parameter is detected a signal from the sensor is transmitted through the battery casing to a control and data acquisition module by wireless transmission. The detection of threshold events in the battery enables remedial action to be taken to avoid catastrophic events.

As shown in the flow chart, control and data acquisition module 10 sends a wireless signal 12a to the RF generator and power source 14/interrogation module 16. The RF generator and power source 14/interrogation module 16 send a wireless signal 18a to the induction coils array 20. The induction coils array 20 provides power 22 to the sensor electronic module 24. The sensor module 24 in turn powers 26 a sensor 28. The sensor 28 sends its data 12c to be stored at sensor module 24. The sensor 28 monitors parameters in the battery and provides sensor data that is stored in the sensor electronic module 24.

The flow chart further shows that the battery parameter that has been monitored and detected is transmitted from the battery by a signal back through the induction coils array to the interrogation module and then to the control and data acquisition module. The flow chart shows an embodiment wherein temperature information is monitored and detected in the battery. The sensor module 24 sends the stored data from sensor 28 as signal 12c. The sensor electronic module 24 sends the data as a RF signal 12b back the interrogation module 16/RF generator and power source 14. The interrogation module 16/RF generator and power source 14 send the data to the control and data acquisition module 10.

One critical issue facing widespread adoption of rechargeable lithium ion batteries in large scale is safety. Once these batteries reach internal temperatures of approximately 90° C., self-sustaining exothermic reactions trigger dangerous thermal runaway. The cause of these events can be internal or external short from a variety of causes, included crushing, containment penetration, external heating events, or manufacturing defects. In addition, these batteries are also significantly overdesigned to compensate capacity loss through cycling at moderately high temperatures, with significant capacity loss occurring above 50° C. for virtually every commercially applicable cell chemistry.

Furthermore, these batteries contain a low thermal conductivity plastic (e.g., polyethylene or polypropylene) separator soaked in a non-aqueous electrolytic solution. As a result, when multiple cells are stacked together, it is difficult to remove heat from the more thermally insulated portions of the battery. This makes mitigation of thermal runaway even more difficult, and can cause localized cycling of the battery, which can lead to premature aging. A solution to these problems is provided by the inventors' battery management system that is integral to the battery pack and/or individual cells. When a thermal runaway event is beginning to occur it is sensed by, either active or passive, sensors.

The inventor's disclosed battery management system will be further explained, illustrated, and described in the following examples of systems constructed in accordance with the present battery management system. The examples demonstrate the utility and/or function of the battery management system and help provide a full describe of the battery management system. The examples are intended to be illustrative and not limitative of the present battery management system.

Figure 4:
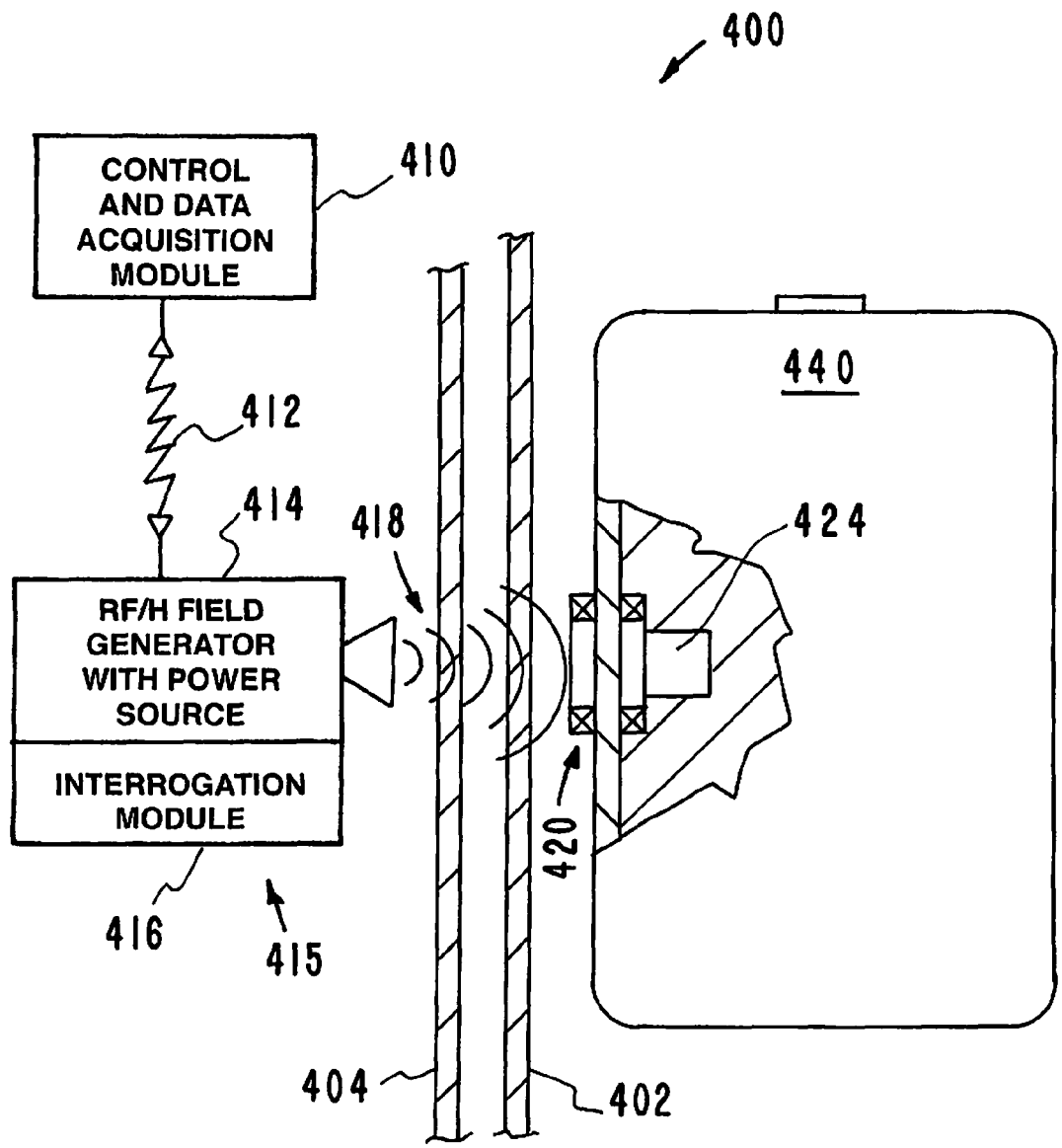
FIG. 4 illustrates another embodiment of inventors' disclosed battery management system.

Referring now to FIG. 4, another embodiment of inventors' disclosed battery management system is illustrated. The battery management system is designated generally by the reference numeral 400. The system 400 includes any number of battery modules or battery packs 402 within a battery pack casing 404. Each individual battery module or pack 402 includes any number of individual battery cells 440. The battery module or pack 402 may for example comprise a number of series-connected and/or parallel-connected battery cells 440 housed within the battery pack casing 404. The system 400 enables detection of various events in the battery module or pack 402 and the battery cells 440. The remote battery management system 400 enables remedial action.

The system 400 includes the following components: nonmetal battery pack housing 404, nonmetal battery pack enclosure 402, control and data acquisition module 410, wireless signal 412, RF generator with power source 414, interrogation module 416, RF signal 418, induction coils 420, sensor electronic module 424, deeply embedded sensors in the layered electronics, and battery 440. The RF generator with power source 414 and the interrogation module 416 are collectively referred to as a transmitter/receiver 415.

The battery management system 400 is an advanced battery management system using sensors 4204 magnetic induction coils 420, RF transmitter and receiver 414, and data collection and storage unit 410. The system 400 enables detection of various events in the cells 440. The sensors 424 enable the detection of various parameter including one or more of the following parameters: cell voltage, cell current, cell impedance, cell temperature, cell internal pressure, stress and strain in the cell package, electrolyte leakage, gas evolution and leakage, optical and nuclear particle transmission and scattering, and any pyrotechnic displays internal to the lithium ion battery pack that may be attributed to the onset of thermal runaway. The sensors 424 may be either active or passive, with communication possible via the magnetic induction coils 420 and RF transmitter and receiver 414 components. Once the sensors 424 detect the onset of an event, the signal is used to appropriately manage pack operation (charge and discharge), and remedial action systems will be activated. The system 400 also leverages specialized computer models and codes as control algorithms in a smart lithium ion battery management system (BMS) unique attributes, enables simultaneous solution of those equations that account for the flow of fluid and heat, chemical reactions, current flow and mechanical stress. The equations that describe electrode kinetics and ionic transport will be integrated into the code. This modeling enables designers to account for subtle, but very important effects such as damage of local circuitry and other vehicular components by the pyrotechnic venting of hot gases. Effective cooling systems, and engineered "fire breaks" and "internal fire suppression methods" can be included. The system 400 has many uses, for example the system 400 has use in connection with high capacity lithium ion lithium ion battery packs for electric and hybrid-electric vehicles, naval systems, aerospace systems, grid storage, and uninterruptable power supplies.

Figure 5:
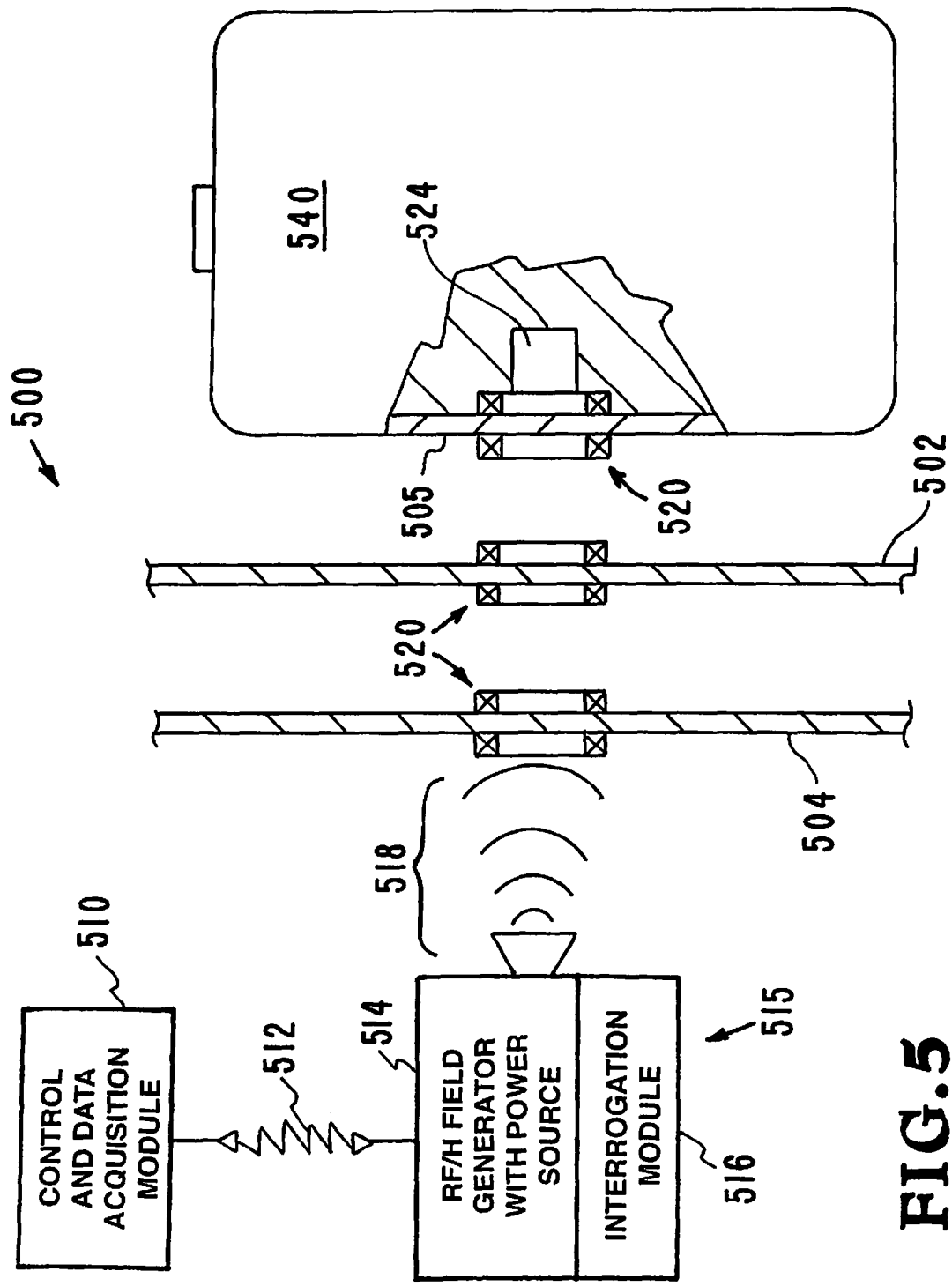
FIG. 5 illustrates yet another embodiment of inventors' disclosed battery management system.

Referring now to FIG. 5, another embodiment of a battery management system constructed in accordance with the present invention is illustrated. The system is designated generally by the reference numeral 500. The system 500 includes the following components: metal battery pack enclosure 502, metal battery housing 504, metal battery casing 505, data collection and storage module 510, WIFI signal 512, RF generator and power source 514, interrogation module 516, RF signal 518, induction coils 520, wireless transmission 518, sensor module 524, and battery 540. The RF generator with power source 514 and the interrogation module 516 are collectively referred to as a transmitter/receiver 515.

The structural components of the battery management system 500 having been identified and described, the operation of the battery management system 500 will now be considered. The battery management system 500 includes a multiplicity of battery packs within the battery housing. Each battery pack includes a multiplicity of individual batteries 540. The battery pack may for example comprise a number of series-connected and/or parallel-connected batteries cells 540 housed within the battery pack wall 502 and battery housing wall 504. A sensor module 524 within the interior of the battery 540 enables the detection of various battery parameter including one or more of the following parameters: temperature, pressure, stress and strain, voltage, current, impedance, electrolyte leakage, gas evolution and leakage, optical and nuclear particle transmission and scattering, and any pyrotechnic displays internal to the battery pack that may be attributed to the onset of thermal runaway.

The sensor module 524 detects the battery parameters and provides a parameter signal that is transmitted to the data collection and storage unit 510. The first set of induction coils 520 are located spanning the wall 505 of the battery casing. The second set of induction coils 520 are located spanning the wall 502 of the battery pack. The third set of induction coils 520 are located spanning the battery housing 504. The first, second and third sets of induction coils 520 provide a magnetic induction communication system that transmits the parameter signal from the sensor 524 to the RF transmitter and receiver 514.

The battery 540 has a casing 505 made of a material that blocks RF transmission. Casings of batteries such as lithium batteries are metal of metal or other material that blocks RF transmission. The battery pack housing 502 and the battery housing 504 are also made of a material that blocks RF transmission. The first, second and third sets of induction coils 520 provide a magnetic induction communication system allow the parameter signal to be transmitted through the casing 505, battery pack housing 502 and the battery housing 504. The system 500 has many uses, for example the system 500 has use in connection with high capacity lithium ion battery packs for electric and hybrid-electric vehicles, naval systems, aerospace systems, grid storage, and uninterruptable power supplies.

Figure 6:
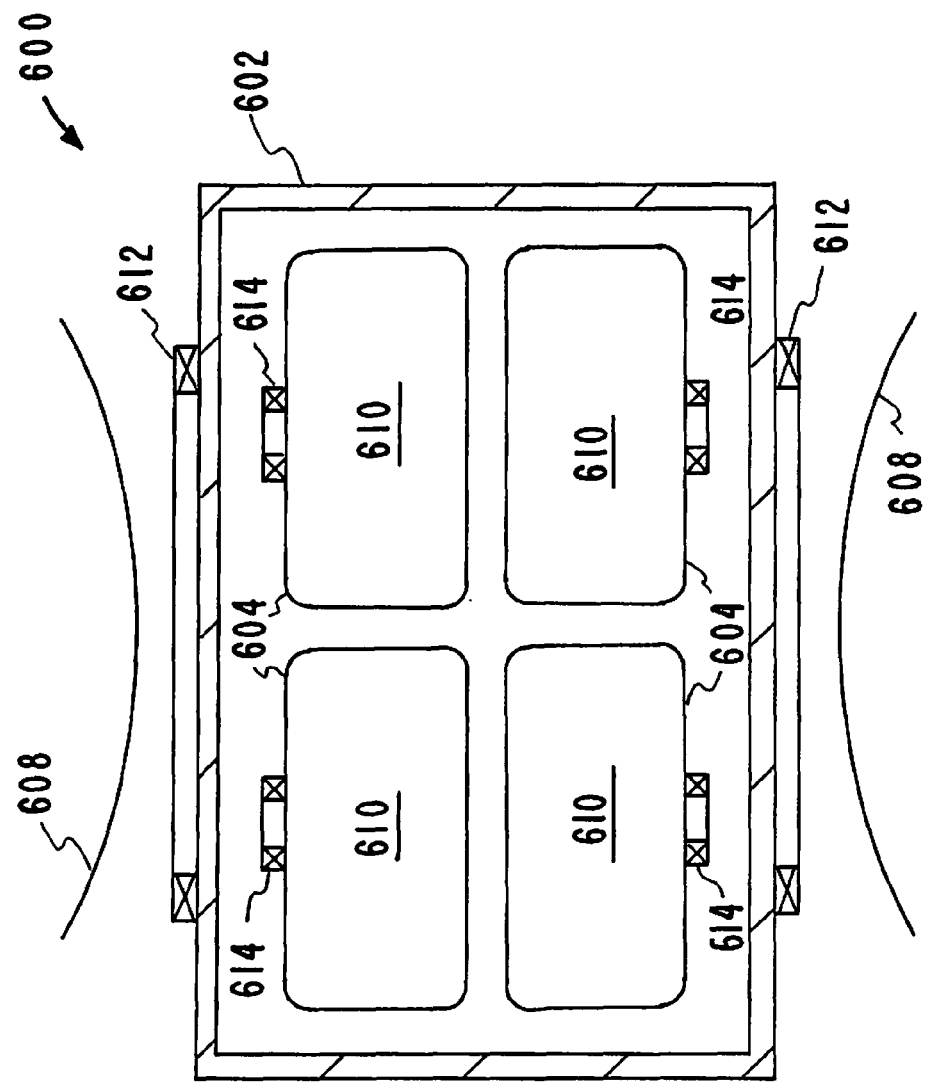
FIG. 6 shows an embodiment similar to the embodiment in FIG. 5.

Referring now to FIG. 6, an embodiment similar to the embodiment 500 illustrated in FIG. 5 is shown. The new embodiment is designated generally by the reference numeral 600. The system 600 includes the following components: metal battery pack housing 602, metal battery casing 604, RF signal 608, individual batteries 610, master induction coils 612, and satellite induction coils 614.

The master induction coils 612 and satellite induction coils 614 provide a magnetic induction communication system that allows a battery parameter signal to be transmitted through the metal battery casings 604 and the metal battery pack housing 602.

The first master induction coils 612 are located spanning the wall of the metal battery pack housing 602. The satellite induction coils 614 are located spanning the metal battery casings 604. The master induction coils 612 and satellite induction coils 614 provide a magnetic induction communication system that transmits the parameter signal from the sensor to the RF transmitter and receiver. The system 600 has many uses, for example the system 600 has use in connection with high capacity lithium ion battery packs for electric and hybrid-electric vehicles, naval systems, aerospace systems, grid storage, and uninterruptable power supplies.

The structural components of the battery management system 600 having been identified and described, the operation of the battery management system 600 will now be considered. The battery management system 600 includes a battery pack with a metal battery housing 602. The battery pack contains a multiplicity of individual batteries 610. The battery pack may for example contain a number of series-connected and/or parallel-connected batteries cells housed within the battery pack housing wall 602. The batteries have casings made of a material that blocks RF transmission. Casings of batteries such as lithium batteries are metal of metal or other material that blocks RF transmission. The battery pack housing 602 is also made of a material that blocks RF transmission. The master induction coils 612 and satellite induction coils 614 provide a magnetic induction communication system that transmits the parameter signal from the sensor to the RF transmitter and receiver.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

The invention claimed is:
1. A battery and monitoring apparatus, comprising:
a metal battery housing made of a metal housing material that blocks RF transmission, a battery pack within said metal battery housing with said battery pack having a metal wall that blocks RF transmission, a multiplicity of individual batteries in said battery pack wherein each individual battery has a metal casing wall made of a metal material that blocks RF transmission, a sensor located inside of said metal casing wall of each said individual battery that senses at least one battery parameter of said individual battery and provides a battery parameter signal, a first induction coil located inside of said metal casing wall and adjacent to said metal casing wall of each said individual battery and operatively connected to said sensor to receive said battery parameter signal, a second induction coil located outside of said metal casing wall located opposite said first induction coil and located adjacent to said metal casing wall of each said individual battery wherein said battery parameter signal is transmitted from said first induction coil to said second induction coil, a third induction coil located inside of said metal wall of said battery pack and aligned with said first induction coil and said second induction coil and operatively connected to receive said battery parameter signal from said second induction coil, a fourth induction coil located outside of said metal wall of said battery pack and aligned with said third induction coil, said first induction coil, and said second induction coil wherein said battery parameter signal is transmitted from said third induction coil to said fourth induction coil, a fifth induction coil located inside of said metal battery housing and aligned with said fourth induction coil, said third induction coil, said first induction coil, and said second induction coil and operatively connected to receive said battery parameter signal from said fourth induction coil, a sixth induction coil located outside of said metal battery housing and aligned with said fifth induction coil, said third induction coil, said first induction coil, and said second induction coil wherein said battery parameter signal is transmitted from said fifth induction coil to said sixth induction coil, a data collection and storage unit, and a RF transmitter and receiver that receives said battery parameter signal from said sixth induction coil and provides said battery parameter signal to said data collection and storage unit.

2. The battery and monitoring apparatus of claim 1 wherein said RF transmitter and receiver includes a wireless RF transmission system and wherein said RF transmitter and receiver provides said battery parameter signal to said data collection and storage unit using said wireless RF transmission system.

3. The battery and monitoring apparatus of claim 1 wherein said sensor located inside of said metal casing wall of each said individual battery that senses at least one battery parameter of said battery and provides a battery parameter signal is a temperature sensor that senses temperature and provides a temperature signal.

4. The battery and monitoring apparatus of claim 1 wherein said sensor located inside of said metal casing wall of each said individual battery that senses at least one battery parameter of said battery and provides a battery parameter signal is a voltage sensor that senses voltage and provides a voltage signal.

5. The battery and monitoring apparatus of claim 1 wherein said sensor located inside of said metal casing wall of each said individual battery that senses at least one battery parameter of said battery and provides a battery parameter signal is a current sensor that senses current and provides a current signal.

6. A method of making a battery with a monitoring system, comprising the steps of:

providing a metal battery housing made of a metal housing material that blocks RF transmission, providing a battery pack within said metal battery housing having a metal wall that blocks RF transmission, providing a multiplicity of individual batteries in said battery pack wherein each individual battery has a metal battery casing made of a metal material that blocks RF transmission, providing a sensor located inside of said metal battery casing of each said individual battery adapted to sense at least one battery parameter of said individual battery, providing a first induction coil located inside of said metal battery casing and adjacent to said metal battery casing of each said individual battery and operatively connected to said sensor, a providing second induction coil located outside of said metal battery casing and located opposite said first induction coil and located adjacent to said metal casing wall of each said individual battery, providing a third induction coil located inside of said metal wall of said battery pack and aligned with said first induction coil and said second induction coil, providing a fourth induction coil located outside of said metal wall of said battery pack and aligned with said third induction coil, said first induction coil, and said second induction coil, providing a fifth induction coil located inside of said metal battery housing and aligned with said fourth induction coil, said third induction coil, said first induction coil, and said second induction coil, providing a sixth induction coil located outside of said metal battery housing and aligned with said fifth induction coil, said third induction coil, said first induction coil, and said second induction coil, providing a RF transmitter and receiver, providing a data collection and storage unit, using said sensor for sensing at least one battery parameter inside said metal battery casing and providing a battery parameter signal;

transmitting said battery parameter signal from inside said metal battery casing through said metal battery casing using said first induction coil and said second induction coil;

transmitting said battery parameter signal from said metal battery casing through said metal wall of said battery pack using said third induction coil and said fourth induction coil, transmitting said battery parameter signal from said battery pack through said metal battery housing using said fifth induction coil and said sixth induction coil, receiving said battery parameter signal outside of said metal battery housing and transmitting said battery parameter signal to said RF transmitter and receiver, and using said RF transmitter and receiver to transmit said battery parameter signal to said data collection and storage unit by wireless transmission for data collection and storage.

7. The method of making a battery with a monitoring system of claim 6 wherein said step of using said sensor for sensing at least one battery parameter inside said metal battery casing and providing a battery parameter signal comprises using said sensor for sensing a temperature battery parameter inside said metal battery casing and providing a battery temperature battery parameter signal.

8. The method of making a battery with a monitoring system of claim 6 wherein said step of using said sensor for sensing at least one battery parameter inside said metal battery casing and providing a battery parameter signal comprises using said sensor for sensing a voltage battery parameter inside said metal battery casing and providing a battery voltage battery parameter signal.

9. The method of making a battery with a monitoring system of claim 6 wherein said step of using said sensor for sensing at least one battery parameter inside said metal battery casing and providing a battery parameter signal comprises using said sensor for sensing a current battery parameter inside said metal battery casing and providing a battery current battery parameter signal.

* * * * *